(12) United States Patent
Giffard

(10) Patent No.: US 6,541,839 B1
(45) Date of Patent: Apr. 1, 2003

(54) MICROELECTRONICS STRUCTURE COMPRISING A LOW VOLTAGE PART PROVIDED WITH PROTECTION AGAINST A HIGH VOLTAGE PART AND METHOD FOR OBTAINING SAID PROTECTION

(75) Inventor: Benoit Giffard, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/486,063

(22) PCT Filed: Sep. 11, 1998

(86) PCT No.: PCT/FR99/01948

§ 371 (c)(1),
(2), (4) Date: Mar. 10, 2000

(87) PCT Pub. No.: WO99/14803

PCT Pub. Date: Mar. 25, 1999

(30) Foreign Application Priority Data

Sep. 12, 1997 (FR) .............................................. 97 11390

(51) Int. Cl.⁷ .......................................... H01L 21/265
(52) U.S. Cl. ........................ 257/504; 257/500; 257/499
(58) Field of Search ........................ 257/373–6, 396–9, 257/400, 499, 500, 501, 504, 509, 519, 520

(56) References Cited

U.S. PATENT DOCUMENTS

| | | | | |
|---|---|---|---|---|
| 4,800,417 A | | 1/1989 | Kato | ............................ 457/59 |
| 4,833,098 A | | 5/1989 | Kato | ............................ 437/38 |
| 5,225,700 A | * | 7/1993 | Smayling | ..................... 257/321 |
| 5,420,061 A | | 5/1995 | Manning | |
| 5,627,399 A | * | 5/1997 | Fujii | ........................... 257/501 |
| 5,648,676 A | * | 7/1997 | Iwai et al. | ................... 257/500 |
| 5,686,754 A | * | 11/1997 | Choi et al. | ................... 257/488 |
| 6,121,661 A | * | 9/2000 | Assaderaghi et al. | ........ 257/355 |

FOREIGN PATENT DOCUMENTS

| | | |
|---|---|---|
| EP | 3223842 | 1/1983 |
| JP | 04042959 | 2/1992 |

OTHER PUBLICATIONS

S. Wolf, "Silicon Processing for the VLSI Era", vol. 2—Process Integration, Lattice Press, Sunset Beach, CA (USA), 1990 (ISBN: 0–961672–4–5). Particularly: pp. 51–59.*

S. Wolf, "Silicon Processing in the VLSI Era", vol. 3—"The Submicron MOSFET", Lattice Press, Sunset Beach, California (USA), ISBN 0–961672–5–3 (1995).*

* cited by examiner

Primary Examiner—Nathan J. Flynn
Assistant Examiner—Johannes Mondt
(74) Attorney, Agent, or Firm—Thelen Reid & Priest LLP; Robert E. Krebs

(57) ABSTRACT

A microelectronic structure with a low voltage part and high voltage part, such that the low voltage part is protected against the high voltage part and process of obtaining this protection.

The structure includes at least one low-voltage element (2) and at least high-voltage element (4) formed on a semiconductor substrate (6). According to the invention, at least one channel (18) is formed, passing through the low-voltage element and one semi-conductor zone is formed with doping opposite to that of the substrate, at least around the walls of the channel or channels and a contact point (24) is established in this zone. Application to smart power integrated circuits.

19 Claims, 4 Drawing Sheets

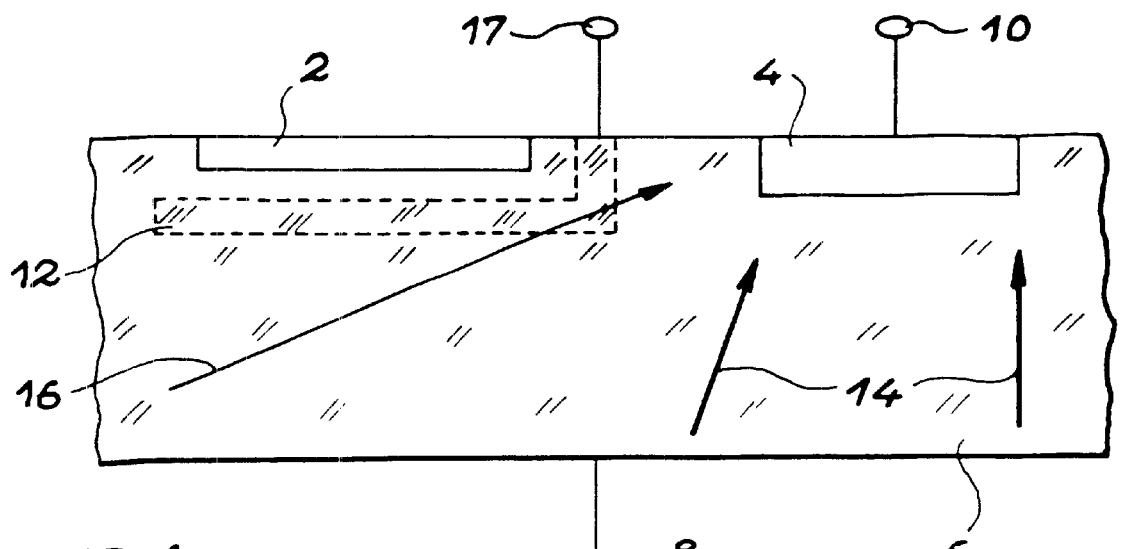
FIG. 1 "PRIOR ART"
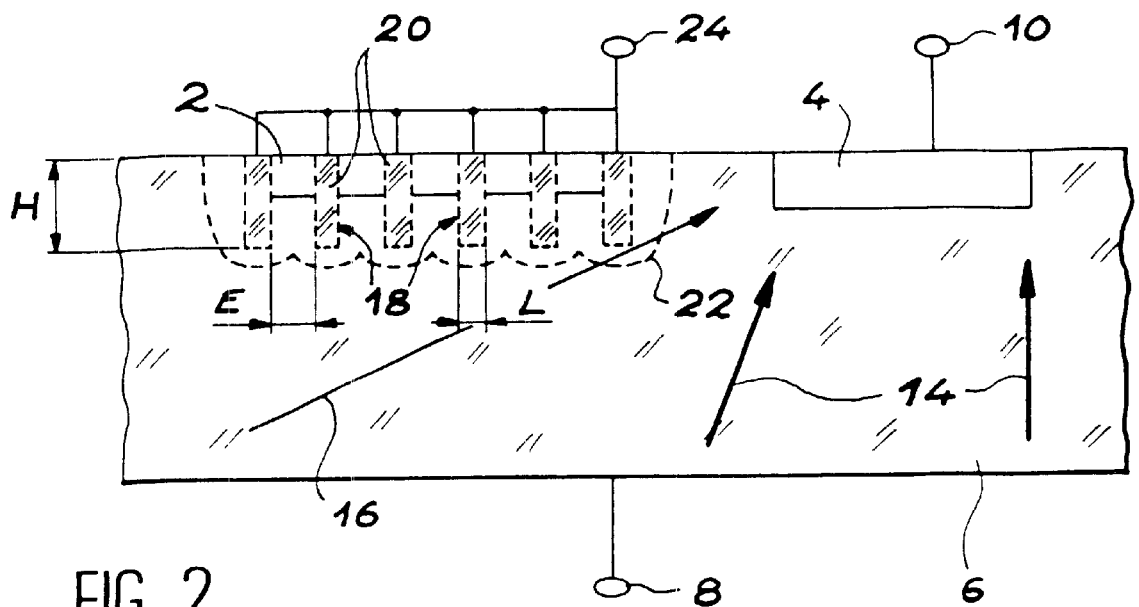
FIG. 2

MICROELECTRONICS STRUCTURE COMPRISING A LOW VOLTAGE PART PROVIDED WITH PROTECTION AGAINST A HIGH VOLTAGE PART AND METHOD FOR OBTAINING SAID PROTECTION

TECHNICAL FIELD

This invention concerns a microelectronic structure comprising:
- at least one low voltage element and one high voltage element, and
- means of protection designed to protect the low voltage element against the unwanted effects generated at the high voltage element, and more particularly from the effects of high voltage element switching.

This invention applies in particular to the field of power electronics, and more specifically to smart power integrated circuit.

PRIOR STATE OF THE ART

With such circuits, there is a problem of protection of the low voltage element(s) (generally control elements, for instance logic control circuits) and more specifically against transient phenomena resulting from the switching of the high voltage element(s) (that are power elements).

During the switching of a high-voltage element, this element goes through considerable voltage and current variations: the voltage may vary by several hundreds of volts and the current by several amperes.

This generates spurious current and voltage pulses throughout the circuit.

These pulses are liable to interfere with the low-voltage element or elements that are far more sensitive to such pulses than is a high-voltage element.

There are several known solutions for resolving this problem.

The first solution consists in moving the low-voltage element or elements away from the high-voltage element or elements.

A solution like this includes a drawback: it requires the use of a large surface area of semi-conductor material.

A second solution consists in limiting the voltage and operating current of the high-voltage element or elements, detrimental to circuit performance.

A third solution consists in isolating the low voltage element or elements in electrically insulating wells, involving a drawback because the circuit manufacturing process becomes complex.

A fourth solution consists in forming low resistance areas (highly doped semi-conductor areas) under the low-voltage element or elements so as to "drain off" the unwanted current obtained from the substrate.

This fourth solution is illustrated in FIG. 1.

FIG. 1 is a transversal schematic sectional view of a power circuit comprising:
- a low voltage zone 2 with one or several low voltage elements, and
- a high voltage zone 4 including one or several high voltage elements.

These zones 2 and 4 are formed on the upper surface of a semiconductor substrate 6.

A contact point 8 is provided on the underside of the substrate 6 for the input high current and the establishing of high voltage.

FIG. 1 also shows a contact point 10 designed for the output of high current from high voltage zone 4.

In conformity with the fourth solution mentioned above, a highly doped zone 12 is formed under the low voltage zone 2 and forms a screen protecting it.

The arrows 14 depicted in FIG. 1 represent the current generated in the substrate during the operation of the high voltage zone.

Arrow 16 shows spurious power current captured by the highly doped zone 12.

FIG. 1 also reveals a contact point 17 provided for the output of spurious current from this highly doped zone 12.

Highly doped zone 12 is a buried zone obtained by surface doping, then epitaxial doping over the entire section of the semiconductor material (generally silicon) on which the circuit is formed.

The fourth solution involves several drawbacks:
- to be implemented, it requires epitaxia, a costly and tricky process,
- epitaxia takes place at high temperature and doping diffusion occurs,
- the architecture of the circuit becomes complex because the high voltage element(s) must be produced in material resulting from epitaxia.

In addition, the establishing of contact with the highly doped buried area is always more difficult to obtain when the area is more deeply buried.

OUTLINE OF THE INVENTION

The purpose of this invention is to remedy the aforementioned drawback.

Its purpose is to obtain a microelectronic structure comprising:
- at least one low voltage element and at least one high voltage element formed on a semiconductor substrate including a first type of doping and,
- means of protection to protect the low voltage element against the unwanted effects generated at the high voltage element, this structure is characterized in that the means of protection include:
- at least one channel passing through the low voltage element;
- a semiconductor zone which has a second type of doping opposed to the first type of doping and which, at the least, encloses the walls of the channel or channels so that such channel or channels drain/drains off the unwanted current generated at the high voltage element and
- a contact point in this area which provides for the output of unwanted current.

According to an advantageous embodiment, the channel or channels will penetrate into the substrate.

According to a specific embodiment, the voltage element includes a semiconductor well having the second type of doping, and each channel is formed by this well and enters into the substrate.

The fact that the channels penetrate into the substrate provides more efficient drainage of the unwanted current (drainage of the areas remote from the low voltage active elements to minimize the unwanted effects on the low voltage element).

In an initial embodiment of the structure of the invention, this zone is part of the substrate and is doped by a doping agent of a type different from the remainder of the substrate, all around the channel.

Preferably, the contact point in this part is obtained by a conductive deposit which partially or totally fills the channel.

According to a second embodiment in the structure of the invention, this area includes a semiconductor material of the doping type, differing from that of the substrate, deposited in the channel, which material entirely or partially fills the channel and the part of the substrate near the walls of the channel through which the doping agent was diffused.

Preferably, the contact point in this second embodiment is obtained by a conductive deposit on said material, which conductive deposit is liable to complete the filling of the channel.

It is noteworthy that the conductive deposit (whatever the embodiment involved) is a means of ensuring that the contact point cannot cover said zone entirely.

According to a specific embodiment of the microelectronic structure referred to in the invention, the channels enclose at least one electronic component forming part of the low voltage element.

In the microelectronic structure referred to in the invention, at least one channel can be continuous or, to the contrary, discontinuous.

Preferably, the depth of each channel beyond the low voltage element will range from a few micrometers to ten micrometers or so.

Also preferably, the width of each channel is around 2 $\mu$m to 5 $\mu$m.

Preferably, the substrate will be of silicon and the material for filling the channels can be doped polysilicon with doping opposite to that of the substrate silicon.

As an alternative, this material can be doped glass with doping opposed to that of the substrate silicon.

In this well, the contact point can be formed by doped or undoped polysilicon.

The purpose of this invention is also a process for the protection of a microelectronic structure comprising at least one low voltage element and at least one high voltage element, formed on a semiconductor substrate featuring an initial type of doping, which process is characterized in that it includes the following steps:

a protective coat is formed at the surface of the structure,
at least one channel is formed through the protective coat and the low voltage element,
a semiconductor area is formed having a second type of doping, opposed to the first type, at least around the walls of the channel or channels so that the channel(s) will drain off the spurious current generated at the high voltage element, and
a contact point is formed in said zone, which contact point provides for the output of spurious current.

In a specific initial embodiment, this zone is obtained by installing, within the substrate and through the walls, a doping product of a type opposing that of the substrate.

Preferably, after installation, the doping agent is activated by heat treatment.

In a second specific embodiment, this zone is obtained by the deposit of material of a doping type opposite to that of the substrate and the heat treatment of the structure, which heat treatment is apt to cause the doping product to diffuse to the outside of the channel or channels.

Whatever the method by which this area is obtained, the contact point is formed by the deposit of conducting material which may possibly complete the filling of the channel.

The protective layer can be preserved or eliminated once the structure has been formed.

According to a specific implementation method of the process covered by this invention, the low voltage element includes:

a semiconductor well having the second type of doping,
spaced areas, electrically insulated from the surface of the well and
at least one electronic component formed within the well in an area between the two zones, and the channels are formed through the spaces separating these two zone from the adjacent insulating zones.

BRIEF DESCRIPTION OF DRAWINGS

This invention will be more clearly understandable on the reading of the description of the embodiment examples given below as a purely indicative and non-limitative measure, with reference to the attached drawings, whereby:

FIG. 1 is a transverse schematic sectional view of a microelectronic structure protected in a known manner and has already been described;

FIG. 2 is a transverse schematic sectional view of a microelectronic structure protected in conformity with the invention;

DETAILED OUTLINE OF THE SPECIFIC METHODS OF ACHIEVEMENT

Figure 3:
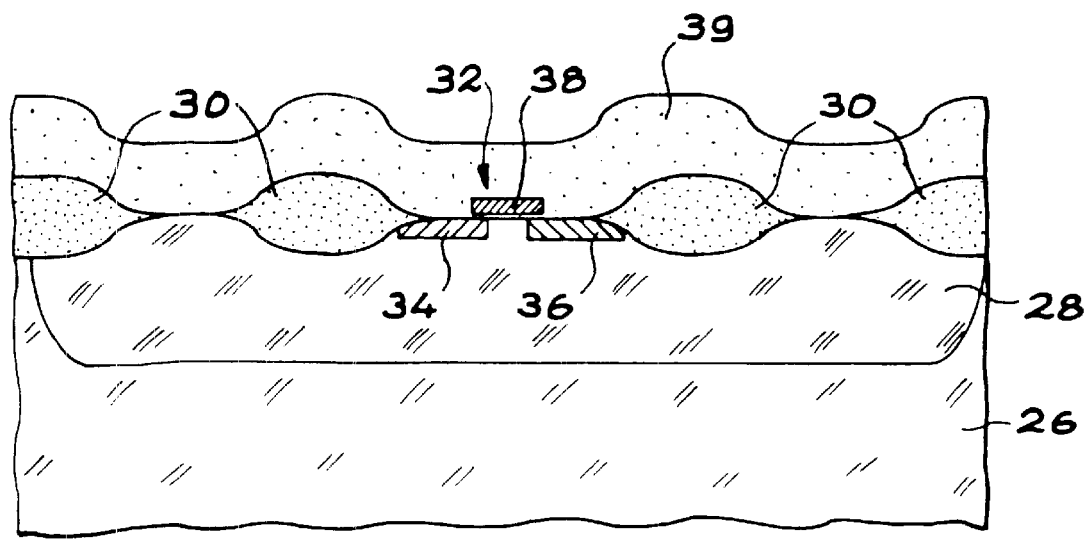
FIGS. 3 to 6 are a schematic illustration of the various steps of a protection process in conformity with the invention and FIG. 7 is a schematic top view of a microelectronic structure conforming with the invention.

The microelectronic structure in conformity with the invention, represented schematically as a transversal section in FIG. 2, differs from the structure of FIG. 1 by the fact that the highly doped area 12 and contact point 17 of this area are eliminated.

Instead of this highly doped area, within the structure of FIG. 2, to protect the low voltage element 2, we have included channels 18 passing through this low voltage element at a sufficient depth to penetrate into substrate 6.

These channels are filled with a semi-conductor material 20 with doping opposed to that of substrate 6. For instance, if the substrate is of type N, this material will be of type P.

These channel, filled with material 20, drain off spurious currents 16 conducted through substrate 6, in particular during the switching of high voltage element 4 and cooperate to form a screen 22 protecting low-voltage element 2 from high-voltage variations produced by the substrate during switchover.

The channels are filled with a semiconductor material 20, the doping of which is opposed to that of the This screen with respect to voltage variations and the drainage of spurious current are better when space E between the channels is reduced because the effect of the influence of these channels filled with material is then greater.

FIG. 2 also reveals a contact point 24 to which all the channels filled with material 22 are connected, and which permits the output of spurious current 16 captured by these channels.

Now, we will explain an example of the process in conformity with the invention for the protection of the structure in FIG. 2, i.e., for the forming of the channels.

We begin by forming a protective channel in the upper surface of the structure.

This protective layer can be, for instance, a layer of silicon oxide when the substrate is of silicon.

Then, by masking etching, we form deep channels in this protective layer, then in the low voltage element, until the channels reach the substrate.

The channels are set to width L of approximately 2 to 5 µm and depth H exceeding the depth of the low voltage element, which depth, for instance, can be 10 µm.

If necessary, oxidization of approximately 50 µm is applied, followed by deoxidization so as to clean the surface of the channels by consuming the silicon (sacrificial oxide).

Then, the channels are filled (conforming filling) if the substrate is of silicon having doping type N, by polysilicon doped with boron in situ.

Polysilicon doping is, for instance, on the order of 1019 to 1020 ions cm-3.

As an alternative we begin by filling the channels with a layer of glass doped with boron (glass type BSG standing for Boron Silicon Glass) with doping of around 1020 cm-3, then the channel filling process is completed with doped or undoped polysilicon to form the contact point.

Subsequently, by etching, we eliminate the polysilicon or the BSG at the surface of the semiconductor structure and, if necessary, eliminate the protective layer by etching.

Preferably, the structure is annealed just before the elimination of the filling material to be found at its surface, or just after elimination so that the doping agent (boron in this example) can diffuse slightly within the substrate around the channels.

FIGS. 3 to 6 illustrate schematically this process in the well of a microelectronic structure formed on a substrate 26 of silicon type N (FIG. 3).

On the upper surface of substrate 26 is a P type zone comprising a P well ("P well") referenced 28.

The silicon oxide layers 30 obtained by a known process known as LOCOS are formed above well 28 and are spaced with respect to one another.

In well 28, one or several NMOS type transistors are produced in the conventional way.

In the example shown in FIG. 3, we have formed a single transistor 32 and we can see source 34 of type N+, drain 36, also type N+, and grid 38 of this transistor, of polysilicon.

The latter is formed in an area of the well included between the two coats of oxide 30.

In conformity with the process of the invention, a silicon oxide protective coat 39 is formed over coats 30 and/or of the transistors.

It is noteworthy that we have not yet formed the transistor contacts and, more generally, the structure and more specifically, the deposit of metal needed for these contacts.

Figure 4:
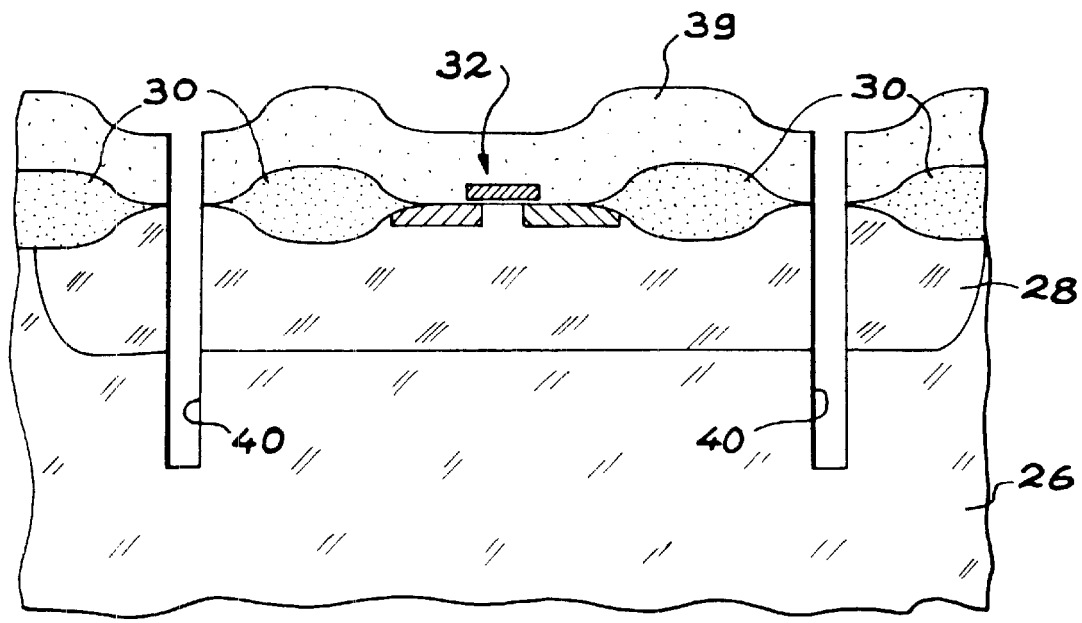

As shown schematically in FIG. 4, we then form two channels 40 by photolithography and anisotropic etching in oxide layer 39 and in the silicon of the well and substrate, then eliminate the photosensitive resin (the photoresist) used for photolithography.

It can be seen that these channels pass through the well and are formed in the spaces between the two layers of oxide 30 between which are located the transistor and the two adjacent coats of oxide 30.

Figure 5:
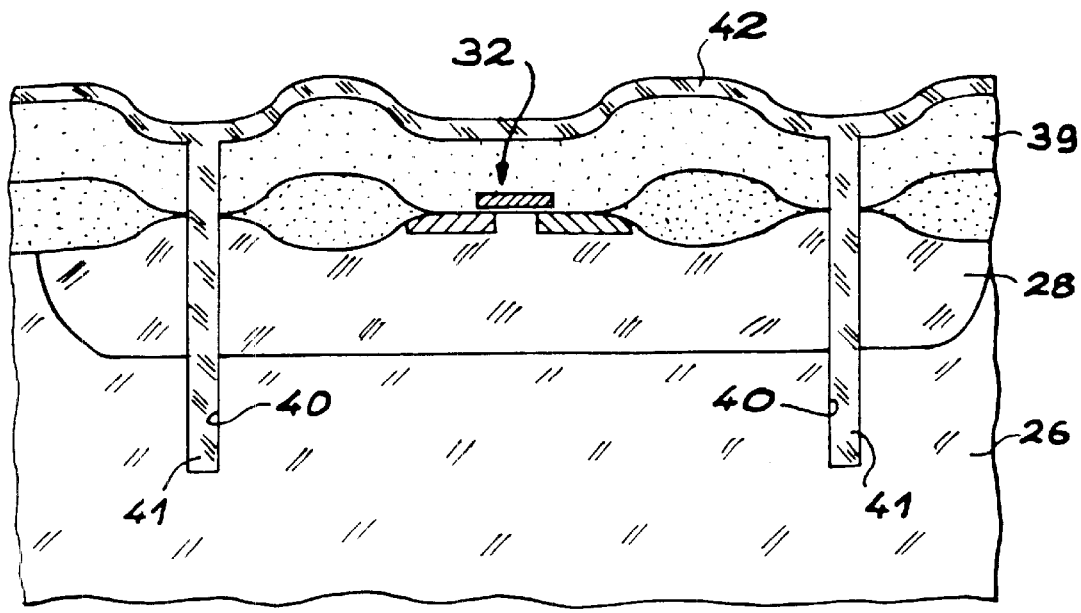

As shown schematically in FIG. 5, a conforming deposit is then obtained by chemical vapor phase deposits of material comprising boron doped polysilicon (in situ doping) to fill the channels with this material 41.

It can be seen that a coat 42 of boron doped polysilicon will be left at the surface of the oxide layer 39.

Figure 6:
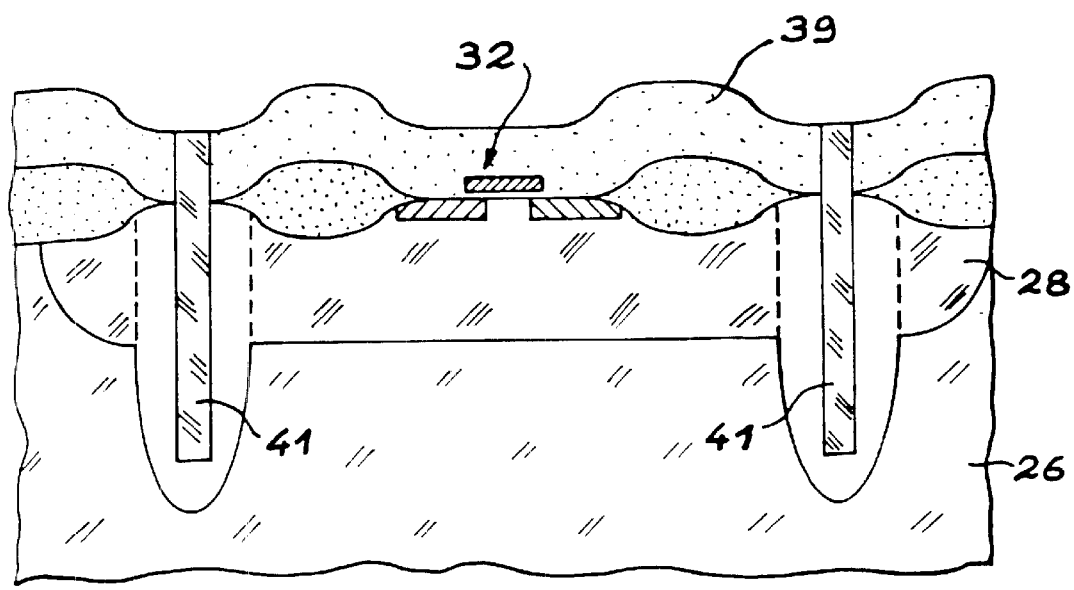

As shown schematically in FIG. 6, this boron-doped polysilicon layer 42 is eliminated by etching, then the structure obtained is annealed so that the doping agent (boron) diffuses into the silicon, and more specifically into well P and into the type N silicon located underneath this well.

In this embodiment, protection coat 39 is preserved. Then, the process is completed by opening the contacts, then applying one or several conventional metalizations.

Figure 7:
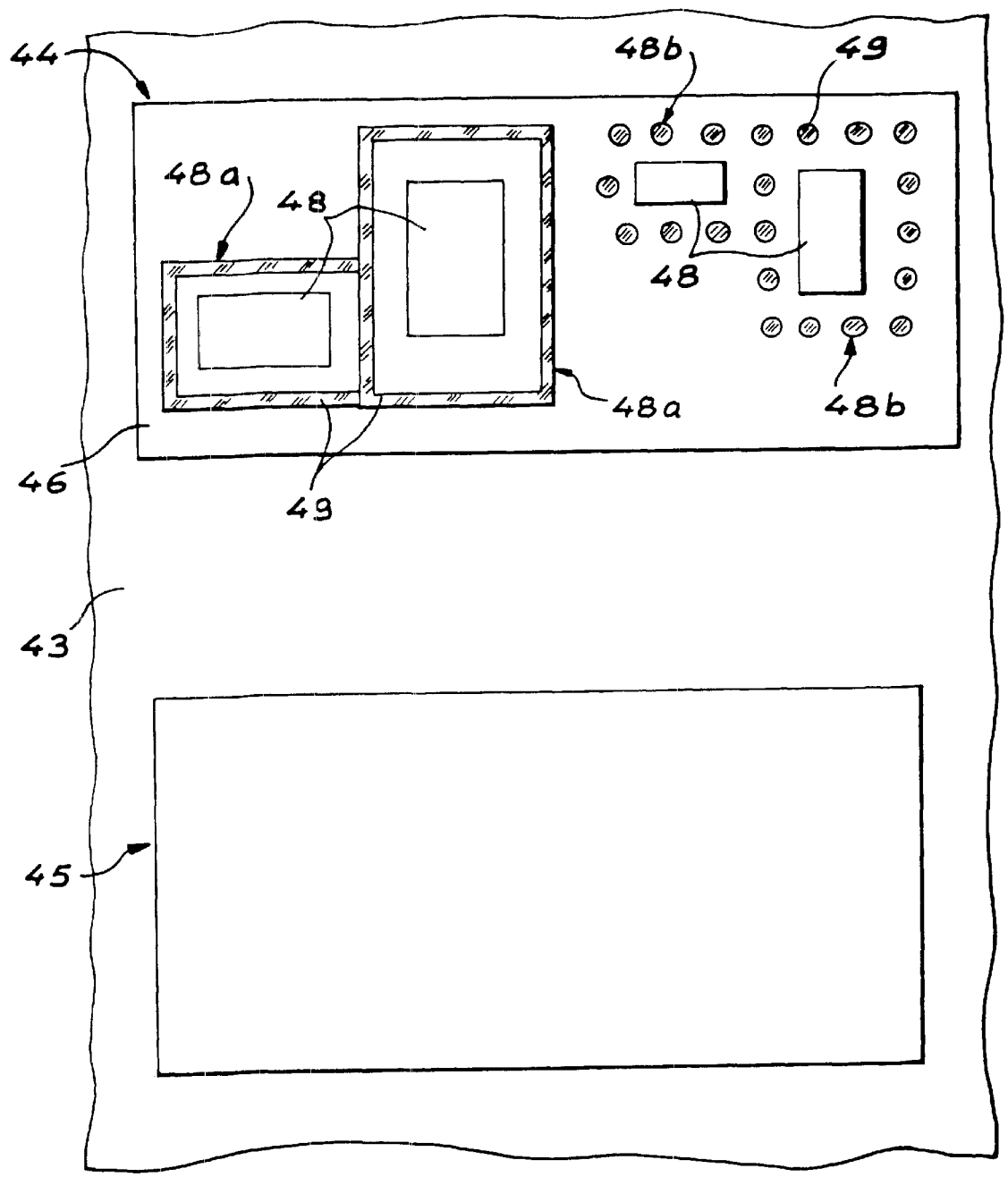

This metalization is designed to form various contacts in the microelectronic structure, in particular for transistor(s) 32 of the low voltage element, for the components in the high voltage element (not shown) that this structure also contains, for the rear face of the substrate and for the channels filled with material 41. FIG. 7 is a top schematic view of the microelectronic structure in conformity with the invention.

FIG. 7 depicts the upper surface of a substrate 43 in which a low voltage element is formed with a high voltage element 45.

Element 44 comprises a well P reference 46 containing various zones 48 in which one or several transistors operating at low voltage are formed.

In the example shown, there are four zones 48.

In conformity with the invention, channels 48a and 48b, filled with P doped semiconductor material (if the substrate is of the N type) are formed through channel P.

In the example of FIG. 7, these channels enclose areas 48 containing the transistor or transistors. In the case of two of the zones, reference channels 48a are continuous and for the other zones 48, the channels reference 48b are discontinuous.

The material 49 filling channels 48a and 48b is diffused, for instance P-doped polysilicon, toward the outside of these channels in order to obtain, as seen previously, doping type zones opposite those of the substrate (N in this example).

In this way, the low voltage element 44 (formed for instance by a control logic element) is moved away from the potential lines from substrate 43.

A screen effect is even better obtained when the points to be protected are closer to a doped deep channel.

Another advantage is the fact that the doped channels form low electric resistors which efficiently drain off P type bearers from the substrate.

This also protects the transistors.

In this case too the effect is increased when the channels are deeper and closer to one another.

What is claimed is:

1. Microelectronic structure comprising:
   at least one low voltage element and at least one high voltage element formed on a semiconductor substrate having a first type of doping and
   means of protection designed to protect the low voltage element against spurious effects generated at the high voltage element,
   wherein the means of protection include:
      at least one channel penetrating into the substrate and passing through the low voltage element, said at least one channel being at least partially filled with a doped semiconductor material having a doping type opposite to the doping type of the substrate,
      a semiconductor zone which has a type of doping, opposite to the type of doping of the substrate and which, at the least, encloses the wall or walls of the channel or channels so that said at least one channel drain off the spurious currents generated at the high voltage element, and
      a contact point in this zone and/or in the trench, said contact point enabling the output of the spurious currents.

2. A microelectronic structure according to claim 1 in which the low voltage element includes a semiconductor well having said second doping type opposite to the doping type of the substrate and in which each channel is formed within this well.

3. A microelectronic structure in accordance with the claim 1 in which said zone is part of the substrate and is doped by a doping agent of a type opposite to the remainder of the substrate all around the channel.

4. A microelectronic structure according to claim 3 in which the contact point in this part is obtained by a conducting deposit.

5. A microelectronic structure according to claim 1 wherein the semiconductor zone includes a semiconductor material and wherein the contact point is obtained by a conducting deposit of said semiconductor material, which conducting deposit completes the filling of the channel.

6. A microelectronic structure according to claim 1 in which the channel or channels enclose at least one electronic component forming part of the low voltage element.

7. A microelectronic structure according to claim 1 in which at least one channel is continuous.

8. A microelectronic structure according to claim 1 in which at least one channel is discontinuous.

9. A microelectronic structure according to claim 1 in which the depth (H) of each channel beyond the low voltage element ranges substantially between 3 to 10 micrometers.

10. A microelectronic structure according to claim 1 in which the width (W) of each channel is substantially between 2 micrometers and 5 micrometers.

11. A microelectronic structure according to claim 1, wherein said substrate is comprised of silicon and said semiconductor zone is comprised of doped polysilicon.

12. A microelectronic structure according to claim 1, wherein said substrate is comprised of silicon and the semiconductor zone is comprised of doped glass.

13. A microelectronic structure according to claim 6 in which at least one channel is continuous.

14. A microelectronic structure according to claim 6 in which at least one channel is discontinuous.

15. A microelectronic structure according to claim 8 in which the depth (H) of each channel beyond the low voltage element ranges substantially between 3 to 10 micrometers.

16. A microelectronic structure according to claim 9 in wich the width (W) of each channel ranges substantially between 2 micrometers and 5 micrometers.

17. A microelectronic structure according to claim 5 in which substrate is of silicon and the material is of doped polysilicon, the doping of which is opposite to that of the substrate silicon.

18. A microelectronic structure according to claim 5 in which the substrate is of silicon and the material comprises doped glass with doping opposite to that of the substrate silicon.

19. A microelectronic structure according to claim 4, wherein the conducting deposit partially fills the channel.

\* \* \* \* \*